US007808335B2

(12) United States Patent
Hemmert (10) Patent No.: US 7,808,335 B2
(45) Date of Patent: Oct. 5, 2010

(54) CIRCUIT ARRANGEMENT AND SIGNAL PROCESSING DEVICE

(75) Inventor: Werner Hemmert, Moosburg (DE)

(73) Assignee: Infineon Technologies AG, Neubiberg (DE)

( * ) Notice: Subject to any disclaimer, the term of this patent is extended or adjusted under 35 U.S.C. 154(b) by 1360 days.

(21) Appl. No.: 10/527,938

(22) PCT Filed: Sep. 5, 2003

(86) PCT No.: PCT/DE03/02956

§ 371 (c)(1),
(2), (4) Date: Nov. 14, 2005

(87) PCT Pub. No.: WO2004/030209

PCT Pub. Date: Apr. 8, 2004

(65) Prior Publication Data

US 2006/0149530 A1    Jul. 6, 2006

(30) Foreign Application Priority Data

Sep. 20, 2002    (DE) ................ 102 43 869

(51) Int. Cl.
*H03B 5/08* (2006.01)
(52) U.S. Cl. .............. 331/167; 331/117 R; 331/117 FE
(58) Field of Classification Search ................ 331/167, 331/175, 185, 117 R, 117 FE
See application file for complete search history.

(56) References Cited

U.S. PATENT DOCUMENTS

| 2,606,969 A | 8/1952 | Scott |
| 2,808,540 A | 10/1957 | Moerkens |
| 3,808,540 A | 4/1974 | Kabrick |
| 3,903,485 A | 9/1975 | Dolb |
| 4,490,843 A | 12/1984 | Bose et al. |
| 5,276,739 A | 1/1994 | Krokstad et al. |

(Continued)

FOREIGN PATENT DOCUMENTS

DE    2401816    12/1982

(Continued)

OTHER PUBLICATIONS

Schukat-Talamazzini, EG (1995) "Automatische Spracherkennung", Friedrich Vieweg & Sohn Verlagsgesellschaft, Braunschweig/Wiesbaden, ISBN 3-528-05492-1, Kapitel 1 bis 3.

(Continued)

*Primary Examiner*—Arnold Kinkead
(74) *Attorney, Agent, or Firm*—Dicke, Billig & Czaja, PLLC (57) ABSTRACT

A circuit arrangement and signal processing device are disclosed. In one embodiment, the circuit arrangement includes a resonator circuit for generating an output signal from an input signal with a capacitance and with an inductance, with an input at which the input signal can be provided, and with an output at which the output signal can be provided. A control circuit is provided for open-loop or closed-loop control of a quality factor of the resonator circuit, the control circuit being configured to control the quality factor of the resonator circuit in an open-loop manner or in a closed-loop manner depending on a signal profile of the signal amplitude of the input signal and/or of the output signal.

19 Claims, 5 Drawing Sheets

U.S. PATENT DOCUMENTS 5,325,184 A    6/1994  Choi
6,606,007 B1 * 8/2003  Washburn ............... 331/116 R
6,838,951 B1 * 1/2005  Nieri et al. ............. 331/177 V

FOREIGN PATENT DOCUMENTS

| JP | 57135595 A | 8/1982 |
|---|---|---|
| JP | 58223909 | 12/1983 |
| JP | 5939529 | 3/1984 |
| JP | 2001217973 | 8/2001 |

OTHER PUBLICATIONS

Ruggero, MA et al. (2000) "Mechanical Bases of Frequency tuning and neural excitation at the base of the cochlea: comparison of basilar-membrane vibrations and auditory nerve-fiber responses in chinchilla", Proc.Natl.Acad.Sci. USA 97 (22) : 11744-11750.

Office Action for Japanese Patent Application No. 2004-538702 mailed Feb. 5, 2008 (2 pages).

\* cited by examiner

CIRCUIT ARRANGEMENT AND SIGNAL PROCESSING DEVICE

CROSS REFERENCE TO RELATED APPLICATIONS

This Utility Patent Application claims the benefit of the filing date of German Application No. DE 102 43 869.2, filed Sep. 20, 2002, and International Application No. PCT/DE03/002956, filed Sep. 5, 2003, both of which are herein incorporated by reference.

FIELD OF THE INVENTION

The invention relates to a circuit arrangement and a signal processing device.

BACKGROUND

Sound signals have a high intensity range, that is to say a high dynamic range of up to 120 dB. The background noise of a rural region at night corresponds to approximately 20 dB, whereas a gunshot has a sound level of approximately 140 dB near to where it is produced.

On account of adaptation processes in the human inner ear, in which the so-called outer hair cells play an important part, normal hearing achieves both a high sensitivity at low sound levels and a high tolerance at high sound levels. The sound level is a physical variable which is a measure of the intensity of the sound. Hearing adapts its amplification to the current sound level and is therefore able to cover a large dynamic range of sound levels between sound received as quiet and sound received as loud. Clearly, a large sound level range is compressed to a small perceptible range. Dynamic range compression is a term used in this connection.

When speech is encoded into action potentials of the auditory nerves, the large dynamic range of the sound signals (up to 120 dB) is compressed to the limit dynamic range of the sensory cells or of a neural system (approximately 40 dB).

Speech recognition systems, hearing aids and audio data compression are fields of economic interest. Principles of automatic speech recognition can be gathered from Schukat-Talamazzini, E.G. (1995) "Automatische Spracherkennung" ["Automatic Speech Recognition"], Friedrich Vieweg & Sohn Verlagsgesellschaft, Braunschweig/Wiesbaden, ISBN 3-528-05492-1, Chapters 1 to 3, by way of example.

In a known speech recognition system, a fast Fourier transformation (FFT) is used for spectral analysis of sound signals. The amplitude spectrum obtained is subsequently logarithmized. This clearly corresponds to a dynamic range compression with a logarithmic characteristic curve.

Such a fast Fourier transformation typically uses a time window having a predefined length, which leads to a restricted frequency resolution and temporal resolution. If, as is customary in speech recognition, only the absolute value spectrum is used, the temporal resolution is limited by the length of the time window used. What is problematic when using a time window having a fixedly predefined size is that an error based on the finiteness of the time window is obtained in the event of an alteration of the spectrum after the inverse transformation.

U.S. Pat. No. 3,808,540 discloses a device for reducing the apparent loudness of an output signal in a radio broadcasting system, which device has a frequency-selective gain reducing network.

DE 24 01 816 C2 discloses a circuit arrangement for compressing the dynamic range of an input signal.

SUMMARY

The present invention provides a circuit arrangement and a signal processing device which enable an improved dynamic range compression.

In one embodiment, the circuit arrangement has a resonator circuit for generating an output signal from an input signal. The resonator circuit contains a capacitance and an inductance, an input at which the input signal can be provided, and an output at which the output signal can be provided. Furthermore, the circuit arrangement has a control circuit for the open-loop or closed-loop control of the quality factor of the resonator circuit, the control circuit being set up in such a way that it controls the quality factor of the resonator circuit in an open-loop manner or in a closed-loop manner depending on the amplitude, preferably depending on the signal profile of the signal amplitude, of the input signal and/or of the output signal.

In other words, the quality factor is preferably controlled in an open-loop manner or in a closed-loop manner depending on the signal profile of the signal amplitude, which clearly entails the advantage that the temporal dependence of the input signal and/or of the output signal itself is mapped onto the temporal dependence of the quality factor, thereby enabling a quasi-instantaneous, delay-free control of the quality factor. It must be emphasized, however, that the control of the quality factor depending on the signal profile of the signal amplitude is optional; it is also possible to control the quality factor in an open-loop manner or in a closed-loop manner depending on the amplitude.

Furthermore, the invention provides a signal processing device comprising a circuit arrangement having the features mentioned above. Moreover, the signal processing device contains a further processing unit for further processing of the output signal.

One basic idea of the invention can be seen in the fact that the quality factor of the resonator circuit is set based on the amplitude of the input or output signal. If one of these signals has a very high amplitude, then the quality factor of the resonator circuit can be greatly reduced by means of the control circuit in such a way that the signal is greatly attenuated. By contrast, in the case of a signal having a low amplitude, the quality factor can be increased in such a way that an only very weakly attenuated signal is provided at the output of the circuit arrangement.

Clearly, the invention, for the purpose of carrying out a dynamic range compression, makes use of the fact that a resonator circuit, near its resonant frequency, acts as a sufficiently stable amplifier (resonance boost).

The quality factor of a resonator circuit is understood to mean, in particular, the ratio of an amplitude of an output signal at or near the resonance frequency of the resonator circuit to the corresponding amplitude at a frequency that is greatly different from the resonant frequency. The quality factor of a resonator circuit depends on the nonreactive resistance thereof, so that the quality factor can be set for example by means of controlling the nonreactive resistance of the resonant circuit in an open-loop manner or in a closed-loop manner.

In a scenario in which the quality factor of the resonator circuit is set based on the amplitude of the input signal introduced into the resonator circuit, the functionality of the control circuit can be referred to as "open-loop control". If, by contrast, the quality factor of the control circuit is based on the amplitude of the output signal, then the control circuit fulfils a "closed-loop control" functionality since it carries out a feedback adaptation of the quality factor.

The circuit arrangement according to the invention enables a reliable and effective dynamic range compression of an input signal in the time domain without the disadvantages of a Fourier transformation occurring. The problems with a finite time window which occur in the case of a Fourier transformation in accordance with the prior art are obviated, in particular.

Moreover, an output signal which is compressed in terms of its dynamic range is generated according to the invention, which output signal has significantly lower interfering signal distortion, e.g., in comparison with the inverse transformation of the logarithmized Fourier spectrum.

The invention enables a sufficiently strong and intensity-selective (e.g. nonlinear) attenuation of an input signal by means of selective reduction of the quality factor of the resonator circuit.

Clearly, the circuit arrangement may be interpreted as a filter circuit, the frequency range for which the resonator circuit is transmissive being defined based on the value of the inductance L and the capacitance C of the resonator circuit. Consequently, setting the values L, C affords a simple possibility for setting the frequency centroid of the transmittable interval of the resonator circuit. The width of the resonance curve of the resonator circuit can be adjusted in particular by means of setting its quality factor. The resonator circuit in its interconnection according to the invention may be regarded as a filter with nonlinear attenuation which can be used to achieve a dynamic range compression that is of arbitrary magnitude, in principle. On account of sufficiently narrow-band processing, distortions that may arise as a result of an excessively great nonlinearity can also be kept sufficiently low.

The circuit arrangement as a filter may contain a second-order resonator circuit, the attenuation rising nonlinearly with a rising sound level. In the case of a passive realization of the circuit arrangement, that is to say when using passive components (coil L, capacitor C, nonreactive resistance R), it is possible to obtain a stable circuit (in contrast to systems that require an active feedback amplifier).

According to the invention, a, for example analog, filter bank is used instead of a fast Fourier transformation (FFT), and a nonlinear attenuation of an input signal based on the sound level of a signal is carried out instead of a logarithmization.

The resonator circuit may have a nonreactive resistance that can be controlled (in an open-loop manner or in a closed-loop manner) by means of the control circuit. Such a nonreactive resistance that can be controlled in an open-loop manner or in a closed-loop manner is a simple circuit component that can be used to fulfill the functionality of regulating the quality factor of the resonator circuit with a low outlay and precisely and stably.

The input signal may be provided between a first terminal of the nonreactive resistance and a first terminal of the capacitance. The output signal may be provided between the first terminal of the capacitance and a second terminal of the capacitance. A second terminal of the nonreactive resistance may be coupled to a first terminal of the inductance and a second terminal of the inductance may be coupled to a second terminal of the capacitance.

The control circuit may be set up in such a way that it controls the quality factor of the resonator circuit based on a Boltzmann function containing the amplitude of the output signal as a parameter. Given a suitable choice of the parameters contained therein, a Boltzmann function is well suited to approximating the sensitivity curve of the outer hair sensory cells in the human inner ear. A particularly good description of this biological dependence may be described by a second-order Boltzmann function. As a result, it is possible to approximate the sensitivity curve in the human ear, which is advantageous for applications of the circuit arrangement in the medical field (for example for a hearing aid).

The control circuit may be set up in such a way that it sets the quality factor of the resonator circuit in a manner dependent on the amplitude of the output signal based on a sensitivity characteristic determined for an ear of a human being. In order to simulate the sensitivity characteristic in the inner ear of a human being particularly well by means of a circuit arrangement according to the invention, a sensitivity characteristic of the human ear that is determined experimentally or theoretically, by way of example, may be stored in the form of a file or table in a manner accessible to the control circuit. In this case, the control circuit can control the quality factor of the resonator circuit in an open-loop manner or in a closed-loop manner in such a way that the biological sensitivity characteristic stored therein is approximated.

The control circuit may be set up in such a way that it sets the quality factor of the resonator circuit to be lower, the higher the amplitude of the output signal.

The control circuit may furthermore be set up in such a way that it sets the quality factor of the resonator circuit in a nonlinear dependence on the amplitude of the output signal. That is to say that signal ranges having a large amplitude are attenuated to a more than proportionally great extent relative to signal ranges having a small amplitude. Consequently, even in the case of an extremely high range of sound levels in an input signal, it is possible to achieve a compression to a sufficiently narrow range in the output signal.

The control circuit may be set up in such a way that it sets the quality factor of the resonator circuit in such a way that the amplitude of the output signal is within a predetermined interval. It may be advantageous for specific applications to keep the amplitude of an output signal always within a predetermined interval. This may be important in the context of data compression, for example, if the intention is to acquire a signal with a high intensity fluctuation with the fewest possible quantization levels. In this case, the control circuit may be set up in such a way that it controls the quality factor of the resonator circuit in an open-loop manner or in a closed-loop manner in such a way that the output signal lies within the predetermined interval.

The circuit arrangement may have a plurality of series-connected resonator circuits, it being possible for an output signal of a resonator circuit that is respectively connected upstream to be provided as an input signal to the resonator circuit that is respectively connected downstream thereof.

In accordance with this particularly advantageous refinement, a filter bank with a cascade connection comprising a plurality of resonator circuits is clearly provided, whereby the dynamic range compression can be extended to an even larger dynamic range. In principle, a sufficiently strong dynamic range compression (e.g., 60 dB) can be effected with just one filter stage (i.e., with one resonator circuit) with a very high quality factor Q (Q=1000, which is reduced to a quality factor of Q=1 at high levels). However, such a circuit arrangement is very narrowband (for example 0.1% of the resonant frequency of the resonator circuit). By means of cascading a plurality of filters (e.g. three cascaded filters) with a relatively low quality factor Q (e.g., Q=10, so that $Q^3$=1000), a sufficiently strong dynamic range compression (e.g. of 60 dB) can likewise be realized according to the invention. The individual quality factor—which is not excessively high—of each of these filters entails the advantageous effect that, on account of the increased bandwidth of the individual filters that results from the lower quality factor, a larger frequency range of the filters is covered and, at the same time, the impulse response of the filters is improved, i.e., the settling and rise time of the system is significantly shorter.

The cascaded resonator circuits can clearly be directly coupled to one another in such a way that the output voltage of a resonator circuit connected upstream is equal to the input voltage of the resonator circuit connected downstream thereof, and that the output current (which generally differs from zero during operation) of a resonator circuit connected upstream is equal to the input current of the resonator circuit connected downstream thereof. For this purpose, the circuit arrangement is generally free of an intermediate element between resonator circuits connected upstream and downstream. This can be realized by means of a circuit arrangement in which the second terminal of the coil of a resonator circuit connected upstream is coupled to the first terminal of the nonreactive resistance of the resonator circuit connected downstream of the resonator circuit connected upstream.

As an alternative, the cascaded resonator circuits may clearly be free of a direct coupling, i.e., be decoupled from one another in a certain manner, in particular with interposition of an intermediate element between the output of a resonator circuit connected upstream and the input of a resonator circuit connected downstream. This is preferably realized in such a way that the output voltage of a resonator circuit connected upstream is equal to the input voltage of the resonator circuit connected downstream thereof, and that the output current of a resonator circuit connected upstream is equal to zero. The input current of the resonator circuit connected downstream essentially results only from the impedance of said resonator circuit. In the case of a circuit arrangement of this type, an operational amplifier (as impedance converter) is preferably provided as intermediate element between a resonator circuit connected upstream and the resonator circuit connected downstream thereof. A first input of the operational amplifier is coupled to the second terminal of the coil of the resonator circuit connected upstream. A second input of the operational amplifier is feedback-coupled to an output of the operational amplifier and is coupled to the first terminal of the nonreactive resistance of the resonator circuit connected downstream of the resonator circuit connected upstream.

In order to reduce the computing power, the quality factor of all the series-connected resonator circuits may be set in identical fashion. In this case, the computing power taken up by the control circuit is kept particularly low since a common quality factor is determined and set for all the resonator circuits, i.e., all the filter parameters are identical. If a circuit arrangement with a particularly high quality requirement is needed, then it is possible, as an alternative, for the quality factor of different series-connected resonator circuits to be set differently for optimization purposes. Consequently, in the case of such a circuit arrangement, the quality factor of each of the series-connected resonator circuits is set in individual fashion.

The circuit arrangement preferably has a plurality of parallel-connected branches, each branch having one resonator circuit or a plurality of series-connected resonator circuits. In this case, the quality factor of a respective resonator circuit can be controlled in an open-loop manner or in a closed-loop manner by means of the control circuit.

In accordance with this particularly advantageous development of the invention, provision is clearly made of a plurality of parallel-connected branches of resonator circuits, in which case a plurality of resonator circuits may be cascaded in each branch.

Preferably, the at least one resonator circuit of a respective branch is set up in such a way that it is transmissive for a respective frequency range of the input signal in such a way that the branches are jointly transmissive for a contiguous frequency interval. The frequency range to which human hearing is sensitive lies approximately between 20 Hz and 20 kHz. In order to cover this audible frequency range, the frequency ranges of transmittable signals are generally different in the parallel arrangement of resonator circuits in different channels. The frequency range of transmittable signals in a resonator circuit is a distribution curve around the resonant frequency with a certain half value width. The resonant frequency is clearly possible by means of setting the values L, C of the resonator circuit; the half value width can be adjusted by means of setting the respective quality factor. If the different frequency passbands of the different branches of resonator circuits are combined, then the result is a preferably contiguous frequency interval by means of which the sensitivity range of human hearing or some other frequency range of interest can be detected.

Preferably, the frequency ranges for which different branches are transmissive overlap one another at least partially. It is ensured in this case that all frequencies are detected, and it is possible to combine the signal components of individual branches.

Preferably, the frequency range for which a respective branch is transmissive can be predefined by means of setting the value of the capacitance and/or the inductance of the at least one resonator circuit of the branch. This is based on the fact that the resonant frequency of a resonator circuit depends on the values of the inductance and the capacitance.

The circuit arrangement of the invention is preferably set up for processing an acoustic signal as input signal. In this case, the circuit arrangement of the invention is suitable for a use in a speech processing system. Such a system may be based for example on pulsing neural networks which rely on a reduction of the dynamic range. Further fields of application are systems for sound processing and (audio) data compression if the intention is to acquire signals with high amplitudes with the fewest possible quantization levels. Moreover, there are applications in the medical field, in particular as a hearing aid in patients with noise deafness.

The circuit arrangement according to the invention may be realized using digital or analog circuit technology.

At least a part of the circuit arrangement, in particular the filters, the open-loop or closed-loop control functionality of the control circuit, may be realized as a computer program. The invention may be realized both by means of a computer program, i.e., software, and by means of one or more special electrical sockets, i.e., in hardware or in any desired hybrid form, i.e., by means of software components and hardware components.

A software realization of the control circuit, in particular, may be effected in "C++", for example. A realization may be effected on any desired processor or DSP (digital signal processor), and likewise on an FPGA module. An FPGA ("field programmable gate array") is an integrated programmable circuit which generally has a multiplicity of programmable cells on a chip.

The signal processing device according to the invention, which has a circuit arrangement according to the invention, is described in more detail below.

Refinements of the signal processing device also apply to the circuit arrangement, and vice versa.

In the case of the signal processing device, the further processing unit may be a speech recognition device or a hearing aid.

When the further processing unit is realized as a hearing aid, an appropriate application is, in particular, one in which the dynamic range compression is carried out in order to compensate for disturbances in the loudness perception of the hard of hearing. In impaired hearing, the outer hair cells may be detrimentally affected, whereby the increase in sensitivity fails at low sound levels. The hearing then clearly always functions with the sensitivity provided for high sound levels. This has the effect that the useable range of sound levels between the threshold of audibility (very quiet) and the discomfort threshold (very loud) becomes smaller (recruitment). In order to compensate for this phenomenon, the circuit arrangement of the signal processing device according to the invention can carry out a dynamic range compression which clearly compresses the large sound level range of the acoustic environment to the patient's perceptible range.

The signal processing device may also form the input for a speech recognition system, in particular in a pulsing neural network architecture.

The signal processing device may be set up as an analog or digital filter bank.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Identical or similar components in different figures are provided with identical reference numerals.

A description is given below, referring to FIG. 1 of a circuit arrangement 100 in accordance with one exemplary embodiment of the invention.

The circuit arrangement 100 contains a multiplicity of resonator circuits 101, each of which has a capacitance and an inductance (not shown in FIG. 1), and also an input at which an input signal can be provided, and an output at which an output signal can be provided. In each case three of the resonator circuits 101 are cascaded along a respective row of the matrix-type arrangement, so that a respective output of a resonator circuit 101 connected upstream is coupled to a respective input of a resonator circuit 101 connected downstream thereof. The values of the inductance and of the capacitance of the resonator circuits 101 of a row are in each case chosen in such a way that the respective row can transmit a signal of a corresponding frequency interval in a range surrounding the resonant frequency of the resonator circuits 101 of the row. The resonator circuits 101 of different rows in each case have different values for L, C, so that the individual rows or branches of resonator circuits 101, taken together, cover a contiguous frequency interval corresponding to the sensitivity range of human hearing (approximately 20 Hz to 20 kHz).

A control circuit 111 is in communication connection to all of the resonator circuits 101, i.e., the control circuit 111 is coupled to all the resonator circuits. The quality factor of each individual one of the resonator circuits 101 can be set by means of the control circuit 111 for controlling the quality factor of the resonator circuits 101 in an open-loop manner or in a closed-loop manner, the control circuit 111 being set up in such a way that it sets the quality factor of the resonator circuits 101 depending on the amplitude of an output signal of the last resonator circuit 101 of a respective row. By way of example, the quality factor of the resonator circuits $R_{11}$, $R_{12}$, $R_{13}$ is set by means of the control circuit 111 based on the amplitude of a signal at the output of the resonator circuit $R_{13}$.

Figure 1:
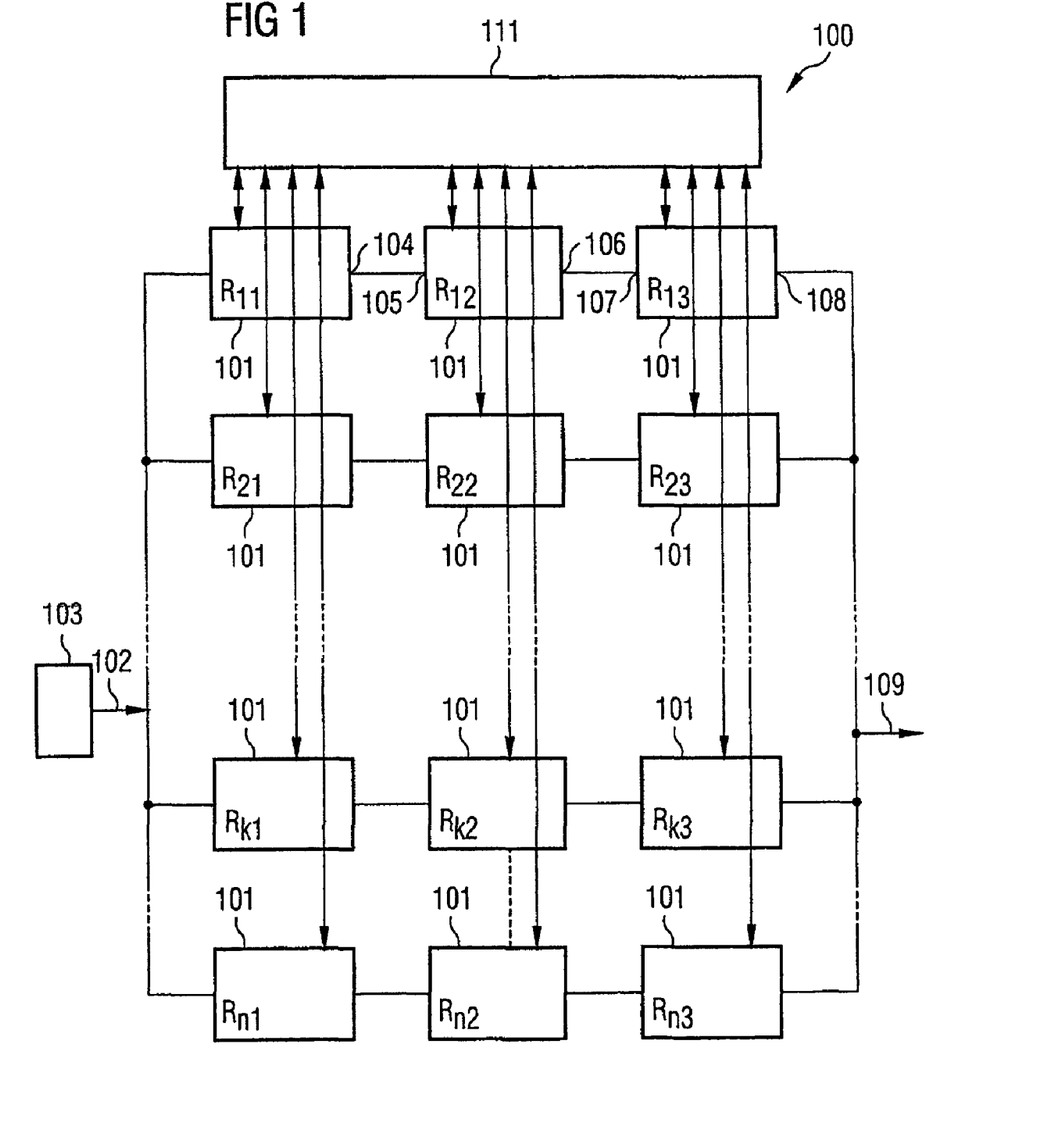
FIG. 1 illustrates a circuit arrangement in accordance with one exemplary embodiment of the invention.

FIG. 1 furthermore shows a sound source 103, which emits an acoustic signal as global input signal 102. The latter is provided to the inputs of the resonator circuits 101 ($R_{11}$, $R_{21}$, ..., $R_{k1}$, ..., $R_{n1}$) of the first column of resonator circuits 101.

The resonator circuit 101 $R_{11}$ arranged in the first row and the first column of resonator circuits is considered below. The global input signal 102 from the sound source 103 is provided to said resonator circuit at an input. The resonator circuit 101 $R_{11}$ transmits a frequency component of the global input signal 102 that is dependent on the values L and C assigned to said resonator circuit, which frequency component is provided at an output of the resonator circuit $R_{11}$ as first local output signal 104. Furthermore, the amplitude of the global input signal 102 is altered on account of the functionality of the resonator circuit 101 $R_{11}$, depending on its (present) quality factor Q. The quality factor Q of the resonator circuit 101 $R_{11}$ is regulated by means of a nonreactive resistance (not shown in FIG. 1) of the resonator circuit 101 $R_{11}$, the control circuit 111 providing this regulable nonreactive resistance with a corresponding control signal, whereby the resistor is set to a predetermined value. The quality factor of the resonator circuit 101 is set as a result, so that, in a subsequent processing cycle, an input signal is attenuated to a greater or weaker extent in accordance with this value of the quality factor. Since the circuit arrangement 100 is set up for dynamic range compression of the global input signal 102, signal ranges having a high amplitude are clearly attenuated to a greater extent than signal ranges having a low amplitude.

The first local output signal 104 is provided to the resonator circuit 101 $R_{12}$ connected downstream of the resonator circuit 101 $R_{11}$ as first local input signal 105. The first local input signal 105 passes through the resonator circuit 101 $R_{12}$, the second local output signal 106 being provided at an output. The second local output signal 106 serves as second local input signal 107 of the resonator circuit 101 $R_{13}$ connected downstream of the resonator circuit 101 $R_{12}$. A third local output signal 108 is provided at the output 108 of said resonator circuit 101 $R_{13}$. Said third local output signal 108 is combined (added) together with the output signals—in each case referred to a separate frequency interval—of the respectively last resonator circuits 101 ($R_{13}, R_{23}, \ldots, R_{k3}, \ldots, R_{n3}$), arranged in a row, to form a global output signal 109.

In the case of each of the resonator circuits 101 of a respective row of resonator circuits ($R_{k1}, R_{k2}, R_{k3}$), the quality factor of all the resonator circuits 101 of the row is regulated based on the amplitude of the output signal at the output of the respective last resonator circuit (resonator circuit $R_{k3}$ in the k-th row) by means of the control circuit 111.

The combined global output signal 109 is thus subjected to a dynamic range compression compared with the global input signal 102.

A description is given below, referring to FIG. 2, of the resonator circuit 101 from FIG. 1.

Figure 2:
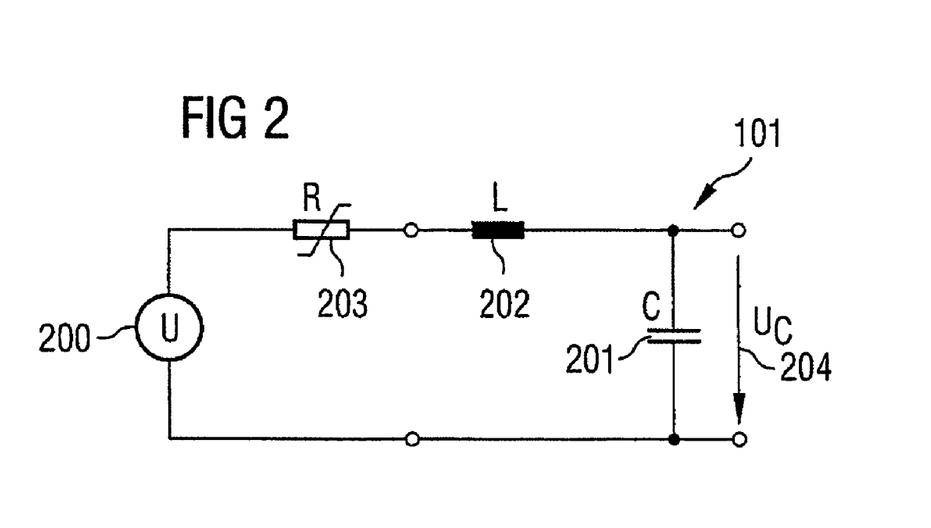
FIG. 2 illustrates a resonator circuit in accordance with an exemplary embodiment of the invention.

In FIG. 2, an input signal 200 is symbolized as a voltage source U.

Furthermore, an output signal 204 is symbolized as a voltage $U_C$. The input signal 200 is provided between a first terminal of a nonreactive resistance 203 and a first terminal of a capacitance 201. The output signal 204 is provided between the first terminal of the capacitance 201 and a second terminal of the capacitance 201. Furthermore, a second terminal of the regulable nonreactive resistance 203 is coupled to a first terminal of an inductance 202, and a second terminal of the inductance 202 is coupled to the second terminal of the capacitance 201.

The value of the nonreactive resistance R 203 can be set by means of the control circuit 111. The resonator circuit 101 from FIG. 2 thus clearly represents a filter with regulable attenuation.

In the case of the circuit arrangement 100 according to the invention, three (or generally N) resonator circuits 101 are cascaded as filter elements in a manner free of feedback in each row. The time-dependent output signal $U_C(t)$, where t is the time, of a filter connected upstream in each case defines the input signal U 200 of the filter connected downstream of the filter connected upstream.

The resistance R 203 can be altered in nonlinear dependence on the output voltage $U_C(t)$ (closed-loop control), in dependence on $U_C(t)$ of the filter respectively connected upstream (open-loop control), or else simultaneously for all filters in dependence on $U_C(t)$ of the last filter stage of a series.

A description is given below of the computation specification on the basis of which the value R of a respective nonreactive resistance R 203 is set in accordance with the exemplary embodiment described.

For this purpose, firstly a quality factor Q to be set is calculated.

In accordance with the exemplary embodiment described, the quality factor Q of the filter is attenuated in accordance with a Boltzmann function:

$$Q(t) = (Q_0 - Q_{\min})\left(1 - \left[\frac{2}{1 + \exp\{-SAT|U_C(t)|\}} - 1\right]\right) + Q_{\min} \quad (1)$$

In equation (1), Q(t) is the dependence of the quality factor Q on the time t. $Q_0$ is a predefinable maximum quality factor of the resonator circuit 101 (e.g., $Q_0$=10). $Q_{min}$ is a predefinable minimum quality factor of the resonator circuit (e.g., $Q_{min}$=1). SAT is a predefinable saturation threshold, that is to say a parameter which can clearly be used to set the time dependence of the quality factor (e.g., SAT=1).

The Boltzmann function (1) approximates the sensitivity curve of the outer hair sensory cells in the inner ear. The function may be replaced as required by a second-order Boltzmann function, which enables an even more accurate adaptation with the introduction of a further parameter. A simple first-order Boltzmann function is used in equation (1) since it has only one free parameter (namely SAT) and can thus be processed with low numerical complexity.

The value of the nonlinear resistance R that is to be set is calculated from the quality factor Q of the filter as:

$$R(t) = \sqrt{L/C} Q(t) \quad (2)$$

Consequently, the time-dependent value of the nonreactive resistance R(t) depends on the value of the inductance L and the capacitance C and also the time-dependent quality factor Q(t).

Equations (1) and (2) form the closed-loop control specification for setting the value R of the nonreactive resistance 203 by means of the control circuit 111.

The filter formed by the resonator circuit 101 shown in FIG. 2 is linear at very low amplitudes $U_C(t)$ (where $Q \rightarrow Q_0$ for $U_C(t) \rightarrow 0$). It is likewise approximately linear at very large amplitudes $U_C(t)$ ($Q \rightarrow Q_{min}$ for $U_C(t) \rightarrow \infty$). The dynamic range compression K is effected in the region of the saturation threshold (SAT) and amounts to $K=Q_0/Q_{min}$. In the case of N=4 cascaded filter stages (in FIG. 1, however, only three filter stages are provided by means of three resonator circuits in a row) and the values $Q_0$=10 and $Q_{min}$=1, it is possible to realize a strong compression by 80 dB ($K_N=(Q_0/Q_{min})^N$).

In order to cover the entire hearing range of a human being, a filter bank is realized with resonant frequencies in the range of approximately 20 Hz to approximately 20 kHz, which is realized by means of typically fifty to a hundred rows of resonator circuits 101 (i.e., n=50 to n=100). In accordance with the exemplary embodiment described, the value of the inductance is defined at L=1H. The respective value C is then calculated from the resonant frequency of the corresponding LC element for each row of resonator circuits 101 in accordance with the filter frequency $f_0$ covered by this row:

$$C = (4\pi^2 f^2 L)^{-1} \quad (3)$$

It should be noted that the nonlinear quality factor Q is calculated independently for each filter frequency $f_0$, i.e., for each row of resonator circuits 101. Referring to FIG. 1, this means that each row of oscillator circuits 101 is assigned a corresponding filter frequency $f_0$ for which the value of the quality factor Q(t) is calculated.

A description is given below, referring to FIG. 3, of a digital wave filter 300 as a realization of the resonator stage 101 shown in FIG. 2.

A digital wave filter represents a class of digital filters having particularly favorable properties. They are modeled on traditional filters from the classical components of telecommunications and are operated with the aid of modern integrated digital circuits. In accordance with the technology of a digital wave filter, an analog model can clearly be realized in digital fashion (for example using a computer).

Figure 3:
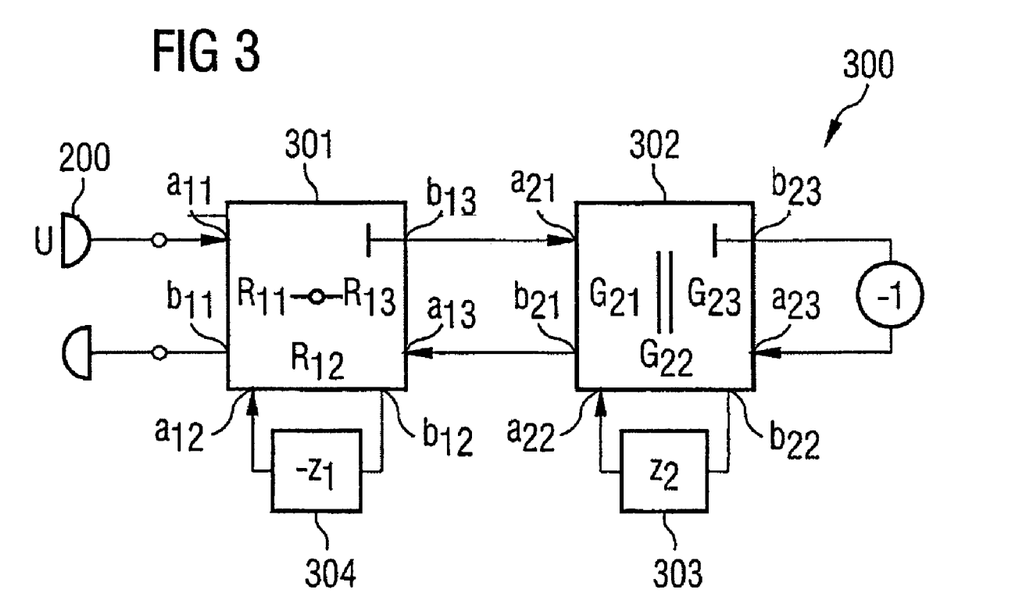
FIG. 3 illustrates a realization of the resonator circuit illustrated in FIG. 2 as a digital wave filter.

The components of the digital wave filter 300 from FIG. 3 are clearly assigned below to the components of the resonator circuit 101 from FIG. 2 and the corresponding variables are defined.

A first block 301 of the digital wave filter 300 contains a reflection-free serial coupler with the impedances R11 and R13. R11 clearly represents the regulable nonreactive resistance R 203, referred to a reference resistance. R12 represents a corrected resistance (impedance) of the coil L 202 referred to a basic frequency. A second block 302 contains a parallel coupler, which reproduces the parallel interconnection of the capacitance 201, the conductances G21, G22, G23 being illustrated in the second block. G21 is an input conductance of the second block (G12=1/R13) 302, G23 is an output conductance of the second block 302. The resistance of the capacitance C 201 is modeled by means of the conductance G22. A third block 303 represents a store or a filter register for the capacitance 201 and a fourth block 304 represents a store or a filter register for the coil 202.

The variables shown in FIG. 3 are defined below. The resistances and conductances for each filter frequency result as:

$$R11 = R/R\_B \quad (4)$$

$$R12 = 2\pi F\_BL/(R\_B \tan[\pi F\_B/f\_s]) \quad (5)$$

$$R13 = R11 + R12 \quad (6)$$

$$G21 = R13^{-1} \quad (7)$$

$$G22 = 2\pi F\_BCR\_B/\tan(\pi F\_B/f\_s) \quad (8)$$

$$G23 = G21 + G22 \quad (9)$$

In this case, R is the nonreactive resistance 203 and R_B is a predefinable reference resistance. F_B is a predefinable reference frequency. The values R_B and F_B serve for scaling. Since the realization in accordance with the exemplary embodiment described is realized with double precision floating variables, this normalization is not relevant, but it is relevant if integer arithmetic is used. L is the inductance of the coil 202. The value f_s is a sampling frequency of the sampled time signal. The variables R11, R12, R13 are nonreactive resistances, whereas the variables G21, G22 and G23 are conductances, that is to say inverse nonreactive resistances.

Filter coefficients g1, g2 result as:

$$g1 = R11/R13 \quad (10)$$

$$g2 = G21/G23 \quad (11)$$

The initial values of the filter registers Z1 (fourth block 304) and Z2 (third block 303) are initialized at zero.

The signals at the individual ports can be calculated progressively. For the "forward wave" of the signal, that is to say clearly the coefficients on the arrows oriented toward the right in accordance with FIG. 3, the following result:

$$b13 = -(U + Z1) \quad (12)$$

$$b20 = -g2(Z2 - b13) \quad (13)$$

$$b23 = b20 + Z2 \quad (14)$$

The variable U in equation (12) is the input signal 200.

For the "backward wave", that is to say clearly the arrows oriented toward the left in accordance with FIG. 3, the following coefficients result:

$$b22 = b20 + b23 \quad (15)$$

$$b21 = b22 + Z2 - b13 \quad (16)$$

$$a0 = b21 - b13 \quad (17)$$

$$b12 = U - g1a0 \quad (18)$$

$$b12 = -(b11 + b21) \quad (19)$$

The output signal $U_C$ 204 is then calculated as:

$$U_C = (b22 + Z2[sec])/2 \quad (20)$$

The filter registers (blocks 303, 304) are updated as follows:

$$Z1 = b12 \quad (21)$$

$$Z2 = b22 \quad (22)$$

The output signal $U_C$ 204 is transferred as input signal U 200 to the filter stage 101 connected downstream of the filter stage 101 under consideration. Based on the output signal $U_C$ 204 of the last filter stage 101 of a row of filter stages 101, the quality factor to be set of the cascaded filters 101 is determined anew in accordance with equation (1). From the value determined in this way for the quality factor Q, the value of the resistance R that determines the attenuation is calculated in accordance with equation (2). With the altered value of the nonreactive resistance R 203, the filter resistances (R11, R12, R13, G21, G22, G23) and filter coefficients (g1, g2) are calculated anew in accordance with equations (4) to (11). After this process, the output signal is calculated for a next time slice. In other words, the time spectrum can be broken down into a plurality of time slices which are progressively numerically calculated.

Figure 4:
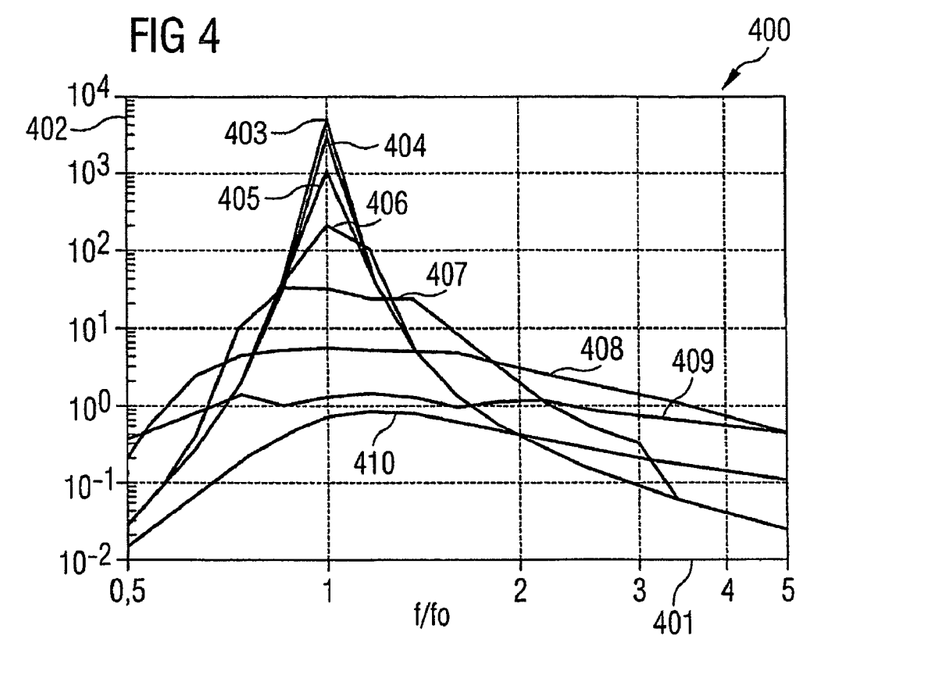
FIGS. 4 and 5 illustrate diagrams for illustrating the functionality of the circuit arrangement according to the invention.

An explanation is given below, referring to FIG. 4, of a diagram 400 showing the functionality of the circuit arrangement according to the invention in accordance with a preferred exemplary embodiment of the invention. Diagram 400 relates to a circuit arrangement with N=4 cascaded resonator circuits. $Q_0=10$ is assumed as the maximum Q value and $Q_{min}=1$ is assumed as the minimum Q value.

The frequency of a signal normalized to a reference frequency $f_0$ is plotted in a logarithmic representation along an abscissa 401 of the diagram 400. The reaction of the system to an input signal having a specific intensity is shown in a logarithmic representation along an ordinate 402. First to eighth curves 403 to 410 represent the frequency response (i.e. here the respective value of the maximum amplitude of the filter output) of the circuit arrangement according to the invention for various signal amplitudes (referred to a reference amplitude).

The first curve 403 corresponds to an amplitude of $1\times10^{-9}$, the second curve 404 corresponds to an amplitude of $1\times10^{-4}$, the third curve 405 corresponds to an amplitude of $1\times10^{-3}$, the fourth curve 406 corresponds to an amplitude of $1\times10^{-2}$, the fifth curve 407 corresponds to an amplitude of $1\times10^{-1}$, the sixth curve 408 corresponds to an amplitude of $1\times10^{0}$, the seventh curve 409 corresponds to an amplitude of $1\times10^{1}$ and the eighth curve 410 corresponds to an amplitude of $1\times10^{6}$. Furthermore, a sinusoidal oscillation windowed with a $\cos^2$ window is assumed as the input signal. Curves 403 to 410 result for an entire filter bank comprising N=4 resonator circuits that are cascaded in a manner free of feedback.

It can firstly be seen from the diagram 400 that the attenuation of the input signal is greater, the higher the signal intensity or signal amplitude. At very small amplitudes, the filters are linear and the resonance boost is approximately 80 dB. The response of the filter bank decreases very sharply to high low frequencies since the filters are realized as low-pass filters (cf. FIG. 2). The high-frequency response of the filters falls at approximately 6 dB per octave, due to the scaling of the filter parameters with $f_0$. The curves in FIG. 4 simulate the greatly asymmetrical frequency selectivity of human hearing to a good approximation.

A description is given below, referring to FIG. 5, of the relationship between amplitudes of the input signal and of the output signal of a circuit arrangement according to the invention.

In the diagram 500, a sound pressure level $A_{in}$ in dB, referred to a sound pressure of the reference magnitude 20 µPa, is plotted in a logarithmic representation along an abscissa. The strength of an output signal $A_{out}$ in dB is plotted in arbitrary units along an ordinate 502. Curves 503 to 507 show, for various scenarios the growth function of a filter cascade comprising four resonator circuits (cascading of N=4 filters) at the resonant frequency $f_0$. $Q_{min}=1$ is assumed as the minimum quality factor.

A first curve 503 shows a linear growth function. A second curve 504 shows a growth function of the inner ear, i.e. the speed of the basilar membrane relative to the sound pressure measured in front of the eardrum. The data of the second curve 504 are taken from [2]. A third curve 505 shows the curve profile for a quality factor Q=2, a fourth curve 506 shows the profile for Q=4 and a fifth curve 507 shows the profile for Q=10.

Figure 5:
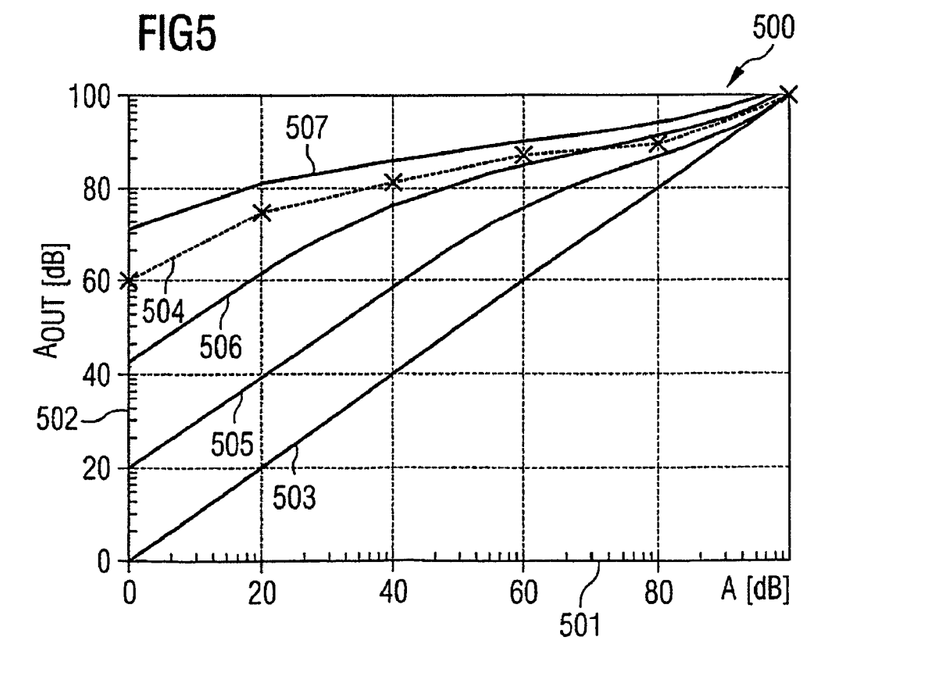

FIG. 5 thus clearly shows the growth function of a filter output for $f=f_0$ with the filter quality factor Q as a parameter. At very large and very small amplitudes, the growth functions are approximately linear. What is striking is the large compression range (particularly for a large Q) extending over more than four decades. The large dynamic range of the input signal (100 dB) is compressed to 40 dB (for Q=10). On account of the resonance boost, quiet signals are "amplified" in a frequency-specific manner. The growth function simulates very well oscillation responses measured on a living auditory system (cf. with curve 504). Therefore, an approximately technical simulation of the nonlinear preprocessing in the inner ear is realized by means of the circuit arrangement according to the invention.

A description is given below, referring to FIG. 6A, of a circuit arrangement 600 in accordance with another preferred exemplary embodiment of the invention.

The circuit arrangement 600 is formed from a first resonator circuit 601 and a second resonator circuit 602, each of which is constructed like the resonator circuit 101 shown in FIG. 2. The second resonator circuit 602 is connected downstream of the first resonator circuit 601.

The circuit arrangement 600 can clearly be regarded as a directly coupled realization of two (N=2) cascaded resonator circuits 601, 602.

Figure 6A:
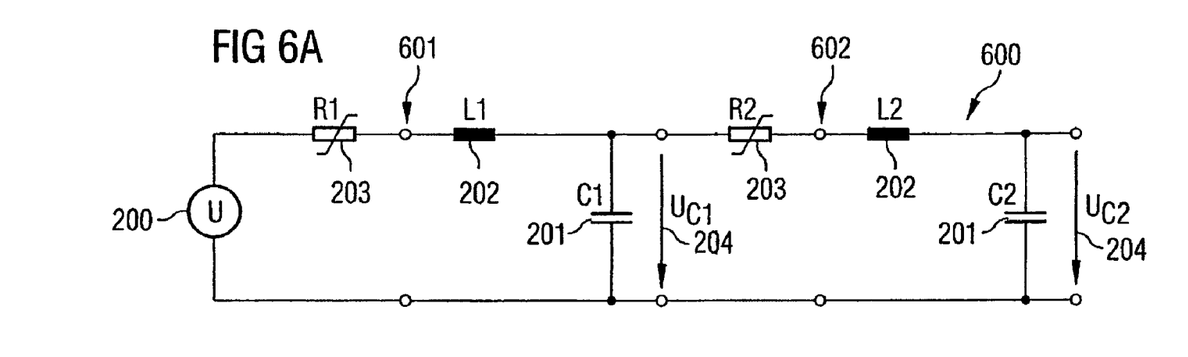
FIG. 6A illustrates a circuit arrangement in accordance with another preferred exemplary embodiment of the invention.

As shown in FIG. 6A, the second terminal of the coil 202 of the resonator circuit 601 connected upstream is coupled to the first terminal of the nonreactive resistance 203 of the second resonator circuit 602 connected downstream.

In accordance with the exemplary embodiment of resonator circuits 601, 602 that are directly coupled to one another as shown in FIG. 6A, the output voltage $U_{C1}$ of the resonator circuit 601 connected upstream is equal to the input voltage of the downstream resonator circuit 602. Furthermore, the output current of the first resonator circuit 601 is equal to the input current of the second resonator circuit 602.

It should be noted that the values of the resistances R1 and R2, of the inductances L1 and L2 and also of the capacitances C1 and C2, respectively, of the resonator circuits 601, 602 may be different from one another or may be set/regulated differently.

Figure 6B:
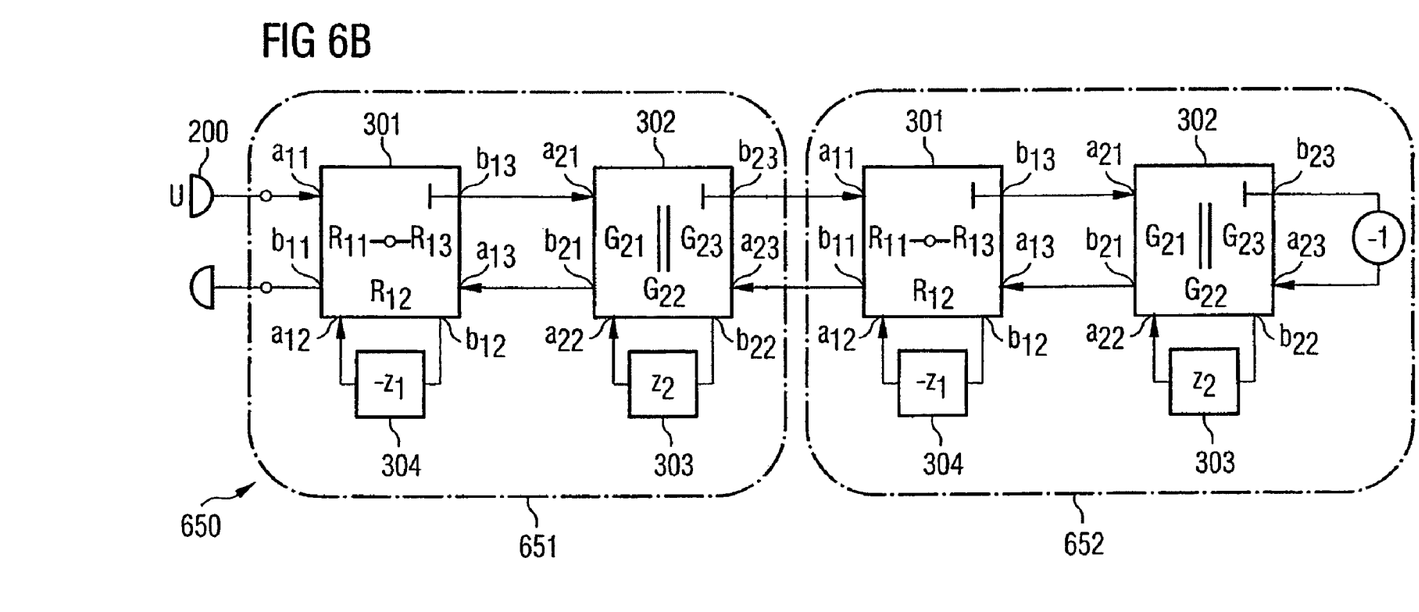
FIG. 6B illustrates a realization of the resonator circuits illustrated in FIG. 6A as digital wave filters.

A description is given below, referring to FIG. 6B, of a realization of the resonator circuits 601, 602 shown in FIG. 6A as a digital wave filter 650.

The digital wave filter 650 is clearly formed from a first component 651, which represents the first resonator circuit 601, and from a second component 652, which represents the second resonator circuit 602. In a manner corresponding to the coupled configuration of the resonator circuits 601, 602 in accordance with FIG. 6A, the two components 651, 652 are directly coupled to one another in the manner shown in FIG. 6B. The internal construction of each of the components 651, 652 essentially corresponds to that of the digital wave filter 300 from FIG. 3.

Figure 7A:
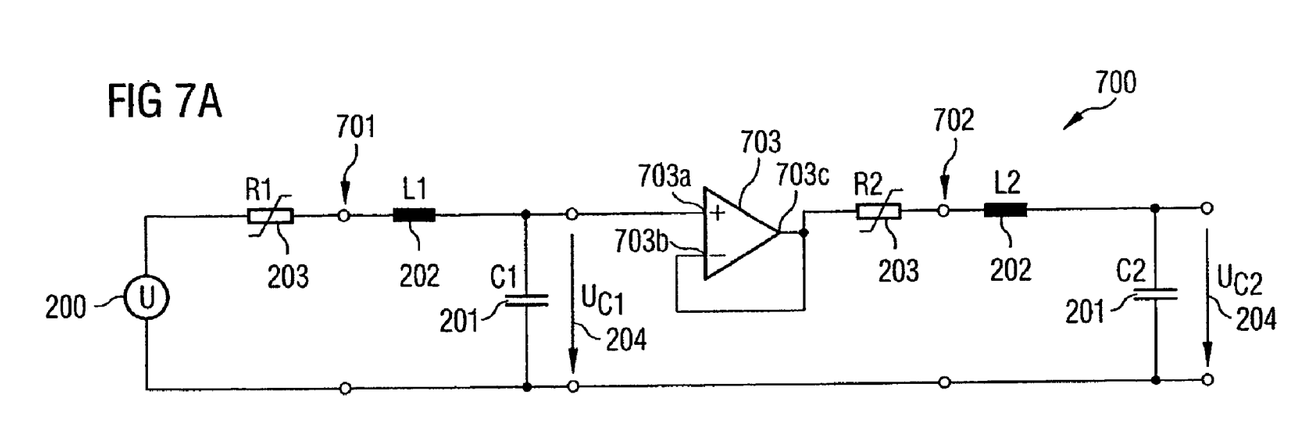
FIG. 7A illustrates a circuit arrangement in accordance with a further preferred exemplary embodiment of the invention.

A description is given below, referring to FIG. 7A, of a circuit arrangement 700 in accordance with yet another exemplary embodiment of the invention.

The circuit arrangement 700 is formed from a first resonator circuit 701 and a second resonator circuit 702, which are connected in series. The resonator circuits 701, 702 are clearly cascaded in a mutually decoupled configuration, i.e. an intermediate element is connected between the resonator circuits 701 and 702.

Each of the resonator circuits 701, 702 is essentially constructed like the resonator circuit 101 shown in FIG. 2. Furthermore, an operational amplifier 703 is provided between the first resonator circuit 701 and the second resonator circuit 702, a noninverting input 703a of the operational amplifier 703 being coupled to the second terminal of the coil 202 of the first resonator circuit 701 connected upstream. Furthermore, an inverting input 703b of the operational amplifier 703 is feedback-coupled to the output 703c thereof and coupled to the first terminal of the nonreactive resistance 203 of the second resonator circuit 702 connected downstream of the first resonator circuit 701.

In accordance with this configuration, the output voltage of the resonator circuit 701 $U_{C1}$ 204 connected upstream is equal to the input voltage of the second resonator circuit 702 connected downstream of the first resonator circuit 701. The output current of a respective resonator circuit is zero. The input current of the second resonator circuit 702 connected downstream of the first resonator circuit 701 connected upstream is based only on the impedance of the second resonator circuit 702 connected downstream. As shown in FIG.

7A, using analog technology a realization of these circumstances can be realized by means of an impedance converter which impresses the output voltage of the resonator circuit 701 connected upstream on the input of the resonator circuit 702 connected downstream.

Figure 7B:
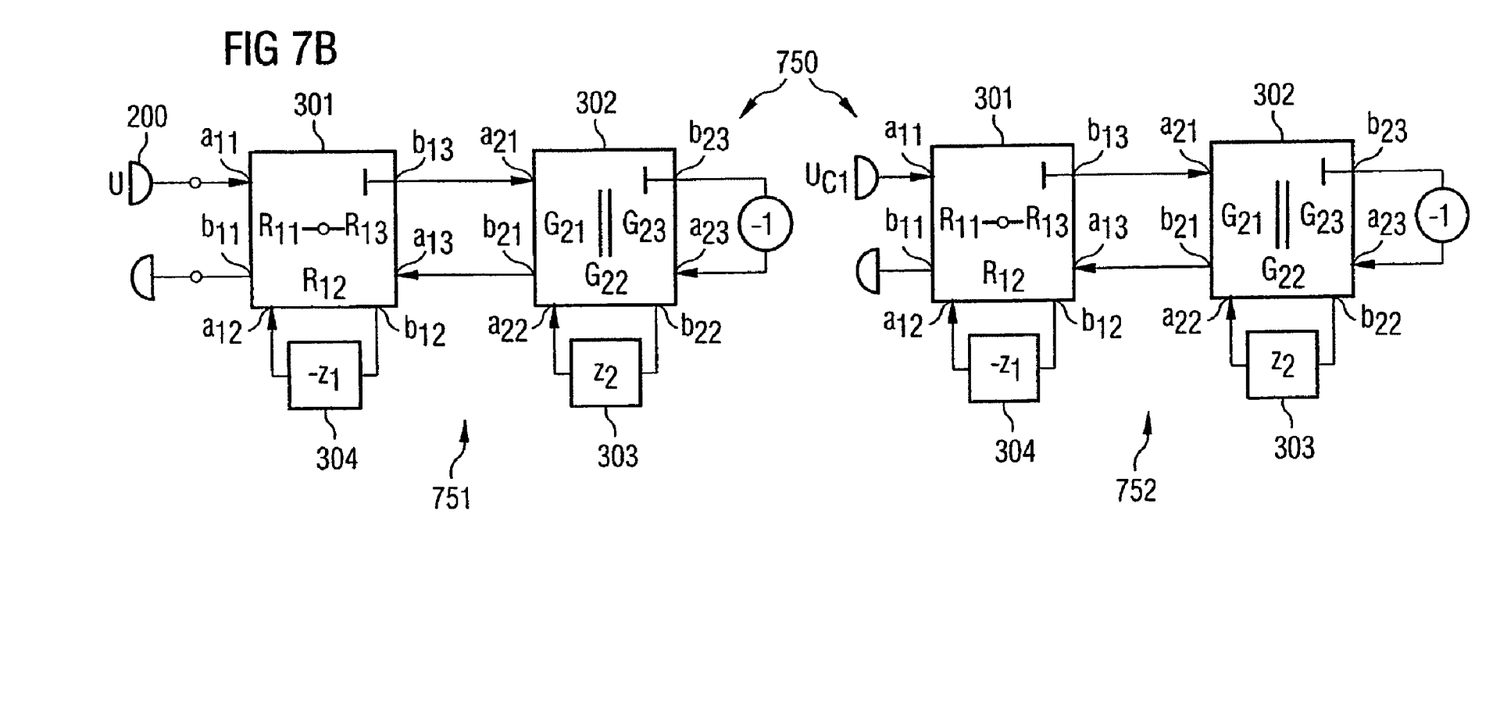
FIG. 7B illustrates a realization of the resonator circuits illustrated in FIG. 7A as digital wave filters.

A description is given below, referring to FIG. 7B, of a digital wave filter 750 as a realization of the circuit arrangement 700 from FIG. 7A.

The digital wave filter 750 is divided into a first component 751 and into a second component 752, the first component 751 representing the first resonator circuit 701, and the second component 752 representing the second resonator circuit 702. On account of the functionality of the operational amplifier 703, the two components 751, 752 are clearly coupled from one another. The internal construction of each of the components 751, 752 essentially corresponds to the configuration shown in FIG. 3. The input signal of the first component 751 is U and the input signal of the second component 752 is $U_{C1}$.

The invention claimed is:

1. A circuit arrangement comprising:
a resonator circuit for generating an output signal from an input signal with a capacitance and with an inductance, with an input at which the input signal can be provided, and with an output at which the output signal can be provided; and
a control circuit for open-loop or closed-loop control of a quality factor of the resonator circuit, the control circuit being configured to control the quality factor of the resonator circuit depending on a signal profile of the signal amplitude of the input signal and/or of the output signal,
wherein the resonator circuit has a nonreactive resistance configured to be controlled by the control circuit.

2. The circuit arrangement of claim 1, wherein:
the input signal can be provided between a first terminal of the nonreactive resistance and a first terminal of the capacitance;
the output signal can be provided between the first terminal of the capacitance and a second terminal of the capacitance; and
a second terminal of the nonreactive resistance is coupled to a first terminal of the inductance and a second terminal of the inductance is coupled to the second terminal of the capacitance.

3. A circuit arrangement comprising:
a resonator circuit for generating an output signal from an input signal with a capacitance and with an inductance, with an input at which the input signal can be provided, and with an output at which the output signal can be provided; and
a control circuit for open-loop or closed-loop control of a quality factor of the resonator circuit, the control circuit being configured to control the quality factor of the resonator circuit depending on a signal profile of the signal amplitude of the input signal and/or of the output signal,
wherein the circuit arrangement is configured to process an acoustic signal as input signal.

4. The circuit arrangement of claim 3, wherein the control circuit is configured to control the quality factor of the resonator circuit based on a Boltzmann function and/or the derivative thereof, the Boltzmann function containing the amplitude of the output signal as a parameter.

5. The circuit arrangement of claim 3, wherein the control circuit is configured to set the quality factor of the resonator circuit in a manner dependent on the amplitude of the output signal based on a sensitivity characteristic determined for an ear of a human being.

6. The circuit arrangement of claim 3, wherein the control circuit is configured to set the quality factor of the resonator circuit to be lower, the higher the amplitude of the output signal.

7. The circuit arrangement of claim 6, wherein the control circuit is configured to set the quality factor of the resonator circuit in a nonlinear dependence on the amplitude of the output signal.

8. The circuit arrangement of claim 3, wherein the control circuit is configured to set the quality factor of the resonator circuit in such a way that the amplitude of the output signal is within a predetermined interval.

9. A circuit arrangement comprising:
a plurality of resonator circuits, each resonator circuit for generating an output signal from an input signal with a capacitance and with an inductance, with an input at which the input signal can be provided, and with an output at which the output signal can be provided; and
a control circuit for open-loop or closed-loop control of a quality factor of the resonator circuit, the control circuit being configured to control the quality factor of the resonator circuit depending on a signal profile of the signal amplitude of the input signal and/or of the output signal,
wherein an output signal of a resonator circuit that is respectively connected upstream to be provided as an input signal to the resonator circuit that is respectively connected downstream thereof.

10. The circuit arrangement of claim 9, comprising wherein a second terminal of the coil of a resonator circuit connected upstream is coupled to a first terminal of a nonreactive resistance of the resonator circuit connected downstream of the resonator circuit connected upstream.

11. The circuit arrangement of claim 9, comprising an operational amplifier between a resonator circuit connected upstream and the resonator circuit connected downstream thereof,
a first input of the operational amplifier being coupled to the second terminal of the coil of the resonator circuit connected upstream; and
a second input of the operational amplifier being feedback-coupled to the output thereof and being coupled to the first terminal of the nonreactive resistance of the resonator circuit connected downstream of the resonator circuit connected upstream.

12. The circuit arrangement of claim 9, comprising wherein the quality factor of all the series-connected resonator circuits is set in identical fashion.

13. The circuit arrangement of claim 9, comprising wherein the quality factor of each of the series-connected resonator circuits is set in individual fashion.

14. A circuit arrangement comprising:
a plurality of resonator circuits, each resonator circuit for generating an output signal from an input signal with a capacitance and with an inductance, with an input at which the input signal can be provided, and with an output at which the output signal can be provided;
a control circuit for open-loop or closed-loop control of a quality factor of the resonator circuit, the control circuit being configured to control the quality factor of the resonator circuit depending on a signal profile of the signal amplitude of the input signal and/or of the output signal; and a plurality of parallel-connected branches, each of which has a resonator circuit or a plurality of series-connected resonator circuits, it being possible for the quality factor of a respective resonator circuit to be controlled by means of the control circuit.

15. The circuit arrangement of claim 14, comprising wherein the at least one resonator circuit of a respective branch is set up in such a way that it is transmissive for a respective frequency range of the input signal in such a way that the branches are jointly transmissive for a contiguous frequency interval.

16. The circuit arrangement of claim 15, comprising wherein the frequency ranges for which different branches are transmissive overlap one another at least partially.

17. The circuit arrangement of claim 15, comprising wherein the frequency range for which a respective branch is transmissive can be predefined by means of setting the value of the capacitance and/or the inductance of the at least one resonator circuit of the branch.

18. A signal processing device comprising:
a circuit arrangement comprising:
   a resonator circuit for generating an output signal from an input signal with a capacitance and with an inductance, with an input at which the input signal can be provided, and with an output at which the output signal can be provided; and
   a control circuit for open-loop or closed-loop control of a quality factor of the resonator circuit, the control circuit being configured to control the quality factor of the resonator circuit depending on a signal profile of the signal amplitude of the input signal and/or of the output signal; and
a processing unit for further processing of the output signal,
wherein the further processing unit is a speech recognition device.

19. The signal processing device of claim 18, configured as an analog or digital filter bank.

* * * * *

UNITED STATES PATENT AND TRADEMARK OFFICE
CERTIFICATE OF CORRECTION

| | | |
|---|---|---|
| PATENT NO. | : 7,808,335 B2 | |
| APPLICATION NO. | : 10/527938 | |
| DATED | : October 5, 2010 | |
| INVENTOR(S) | : Hemmert | |

It is certified that error appears in the above-identified patent and that said Letters Patent is hereby corrected as shown below:

Column 16, line 51, Claim 12, delete "the series-connected" and insert in place thereof --the--.

Signed and Sealed this
Twenty-fourth Day of April, 2012

David J. Kappos
*Director of the United States Patent and Trademark Office*